(12) United States Patent
Huynh

(10) Patent No.: US 10,418,809 B2
(45) Date of Patent: Sep. 17, 2019

(54) POWER MANAGEMENT INTEGRATED CIRCUIT FOR DRIVING INDUCTIVE LOADS

(75) Inventor: Steven Huynh, Fremont, CA (US)

(73) Assignee: Active-Semi, Inc. (VG)

( * ) Notice: Subject to any disclaimer, the term of this patent is extended or adjusted under 35 U.S.C. 154(b) by 1420 days.

(21) Appl. No.: 13/453,649

(22) Filed: Apr. 23, 2012

(65) Prior Publication Data

US 2013/0278301 A1    Oct. 24, 2013

(51) Int. Cl.
  *H02H 9/04* (2006.01)
  *H03K 17/16* (2006.01)
  *H01L 27/02* (2006.01)
  *H01L 23/00* (2006.01)

(52) U.S. Cl.
  CPC ............. *H02H 9/046* (2013.01); *H01L 24/06* (2013.01); *H01L 27/0255* (2013.01); *H03K 17/165* (2013.01); *H01L 2224/05554* (2013.01); *H01L 2224/48091* (2013.01); *H01L 2224/49171* (2013.01)

(58) Field of Classification Search
  CPC ... H01L 27/0255; H02H 9/046; H03K 17/162
  USPC ............... 327/108–112, 309, 318, 319, 320; 361/31
  See application file for complete search history.

(56) References Cited

U.S. PATENT DOCUMENTS

| 5,227,655 | A | * | 7/1993 | Kayama | 257/380 |
| 6,573,562 | B2 | * | 6/2003 | Parthasarathy et al. | 257/338 |
| 6,885,529 | B2 | * | 4/2005 | Ker et al. | 361/56 |
| 7,581,198 | B2 | | 8/2009 | Huynh et al. | 716/1 |
| 7,741,680 | B2 | * | 6/2010 | Zhu et al. | 257/357 |
| 7,904,864 | B2 | | 3/2011 | Huynh et al. | 716/122 |
| 8,161,450 | B2 | | 4/2012 | Huynh et al. | 323/282 |
| 8,558,583 | B2 | * | 10/2013 | Sinow et al. | 327/108 |
| 2010/0199247 | A1 | | 8/2010 | Huynh et al. | 716/8 |

OTHER PUBLICATIONS

"PsoC Programmable System-on-Chip" in Cypress Perform, Cypress Semiconductor Corporation, San Jose, Calif., Doc. No. 001-05356 Rev. Jun. 13, 2011 (47 pages).

* cited by examiner

*Primary Examiner* — Lincoln D Donovan
*Assistant Examiner* — Colleen J O Toole
(74) *Attorney, Agent, or Firm* — Imperium Patent Works; T. Lester Wallace; Amir V. Adibi

(57) ABSTRACT

A power management integrated circuit includes pairs of high-side and low-side drivers, sensing circuitry, and a processor. The high-side and low-side drivers are used in combination with external discrete NFETs to drive multiple windings of a motor. The N-channel LDMOS transistor of each high-side driver has an associated isolation structure and a tracking and clamping circuit. If the voltage on a terminal of the integrated circuit pulses negative during a switching of current flow to the motor, then the isolation structure and tracking and clamping circuit clamps the voltage on the isolation structure and blocks current flow from the substrate to the drain. An associated ESD protection circuit allows the voltage on the terminal to pulse negative. As a result, a large surge of current that would otherwise flow through the high-side driver is blocked, and is conducted outside the integrated circuit through a body diode of an external NFET.

22 Claims, 17 Drawing Sheets

N-CHANNEL LATERAL DMOS OF THE HIGH-SIDE DRIVER
(CROSS-SECTIONAL VIEW)

N-CH LDMOS OF HIGH-SIDE DRIVER

MTPMIC INTEGRATED CIRCUIT

DETAIL OF ONE HIGH-SIDE/LOW-SIDE DRIVER PAIR AND THE
CONNECTION TO A MOTOR TERMINAL

N-CHANNEL LATERAL DMOS OF THE HIGH-SIDE DRIVER
(CROSS-SECTIONAL VIEW)

N-CHANNEL LATERAL DMOS OF THE HIGH-SIDE DRIVER
(TOP-DOWN VIEW)

DETAIL OF N-CH LDMOS
AND NVSICBC

HIGH-SIDE DRIVER ON
LOW-SIDE DRIVER OFF

HIGH-SIDE DRIVER OFF
LOW-SIDE DRIVER OFF

HIGH-SIDE DRIVER OFF
LOW-SIDE DRIVER ON

VOLTAGE ON THE DRAIN RELATIVE
TO SUBSTRATE GROUND
(WITH ISO STRUCTURE)

VOLTAGE ON THE ISO RELATIVE
TO SUBSTRATE GROUND
(WITH ISO STRUCTURE)

TRACKING MODE

CLAMPING MODE

|  | TRACKING MODE | CLAMPING MODE |
|---|---|---|
| $V_d$ * | $V_d$ IS POSITIVE (e.g. +60V) | $V_d$ IS NEGATIVE (e.g. -5V PEAK) |
| IMPEDANCE BETWEEN D AND ISO | <2K (IF $V_d$ > ($V_{iso}$+ 0.7V)) | >2K (e.g. 10K) |
| $V_{iso}$ * | ~$V_d$<br>$V_{iso}$ TRACKS $V_d$ | -0.7V<br>$V_{iso}$ IS CLAMPED TO BE NO MORE NEGATIVE THAN -0.7V |
| $I_{iso}$ | ~0A (A NEGLIBLE NEGATIVE CURRENT) | 500uA MAX |
| N DRIFT VOLTAGE * | +60V | -5V |
| P- WELL VOLTAGE * | +48V | -5V |
| N+ ISO BURIED LAYER VOLTAGE * | +60V | -0.7V |
| P- SUBSTRATE VOLTAGE | 0V | 0V |

* VOLTAGES ARE RELATIVE TO THE VOLTAGE OF THE SUBSTRATE

OPERATION OF THE NEGATIVE $V_d$ SUBSTRATE
INRUSH CURRENT BLOCKING CIRCUIT

FIG. 17

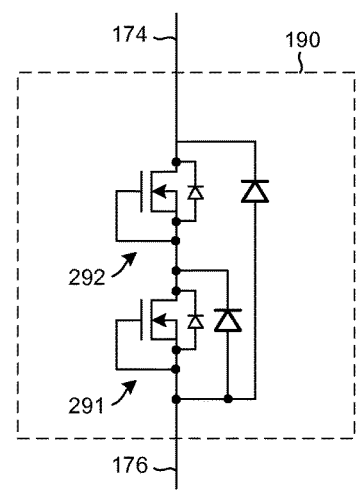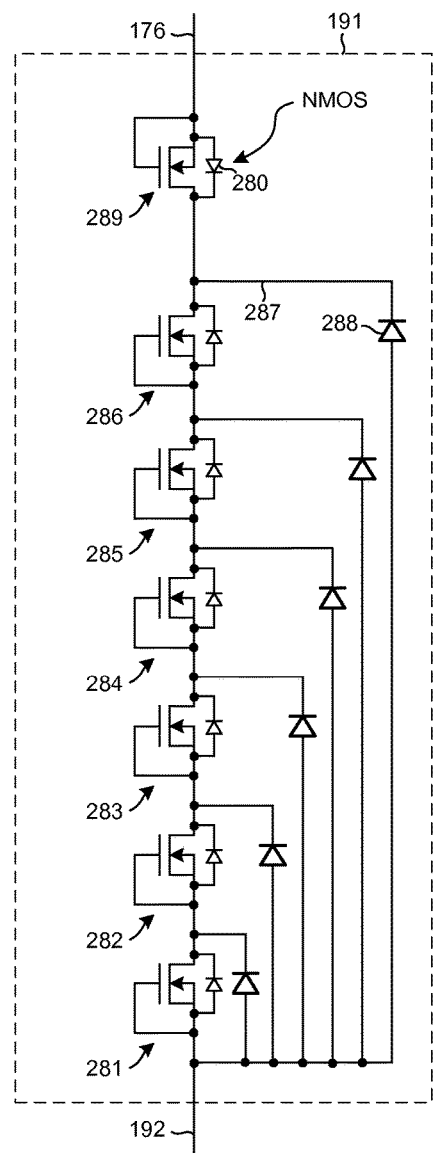
ESD1
FIG. 18
ESD2
FIG. 19

LEVEL SHIFT CIRCUIT

POWER MANAGEMENT INTEGRATED CIRCUIT FOR DRIVING INDUCTIVE LOADS

TECHNICAL FIELD

The present disclosure relates generally to power management integrated circuits for driving inductive loads.

BACKGROUND INFORMATION

FIG. 1 (Prior Art) is a diagram of a circuit 1 that drives a motor 2. The circuit drives the motor by driving a current into a selected one of the motor terminals 3-5 of the motor and out of another selected one of the terminals 3-5 of the motor so that the current flows through a selected pair of the three motor windings 6-8. Integrated circuit 9 has high-side drivers 10-12 and low-side drivers 13-15 organized in three pairs. The high-side and low-side drivers control associated external discrete N-channel field effect transistors (NFETs) 16-21. By controlling which ones of the external discrete NFETs are conductive and nonconductive, currents can be made to flow through selected ones of the windings of the motor so that the motor is driven as desired.

For example, in a first period of time, a current can be driven into motor terminal 3 and drawn out of motor terminal 4. To do this, high-side driver 10 turns on external discrete NFET 16 via terminal 22. Low-side driver 13 controls external discrete NFET 17 to be off via terminal 23. Similarly, low-side driver 15 controls external discrete NFET 21 to be on via terminal 24, and high-side driver 12 controls external discrete NFET 20 to be off via terminal 25. High-side driver 11 controls NFET 18 to be off and low-side driver 14 controls NFET 19 to be off. A current therefore flows from VDC conductor 26, through conductive NFET 16, to node 27, into motor 2 via motor terminal 3, through winding 6, to center node 28, through winding 7 to motor terminal 4, and through conductive NFET 21 to ground conductor 29. After an amount of time, it may be desired to stop the flow of current into motor terminal 3. High-side driver 10 therefore turns external discrete NFET 16 off. Despite that fact that both NFETs 16 and 17 are controlled to be off, the energy stored in the inductance of winding 6 will attempt to draw current from node 27, and this will cause the voltage on node 27 to pulse negative.

Each of the high-side drivers is a complementary logic inverter structure that involves an N-channel pull-down transistor and a P-channel pull-up transistor. In the illustrated example, the pull-down transistor is an N-channel Lateral Double-diffused MOS (N-channel LDMOS) transistor. The pull-up transistor is a P-channel LDMOS transistor. For high-side driver 10, the drains of the two LDMOS transistors are coupled together and to terminal 22. The source of the n-channel pull-down LDMOS transistor is coupled to terminal 30.

FIG. 2 (Prior Art) is a simplified cross-sectional diagram of the n-channel LDMOS pulldown transistor 35 within high-side driver 10. The negative voltage spike on node 27 manifests itself a negative voltage spike on the drain electrode 31 of the transistor. This negative voltage spike can cause an inrush of current that flows from the P type substrate 32, into the N type well 33, and through the N+ type contact diffusion 34, and to the drain electrode 31.

FIG. 3 (Prior Art) is a waveform diagram that shows the voltage on drain electrode 31 relative to ground potential on the substrate 32. In the illustrated example, the pull-down transistor 35 of the high-side driver 10 actually failed due to the high current condition. The voltage on the drain exceeded −0.7 volts, and reached −5.0 volts. In other cases, the pull-down transistor 35 does not fail but nonetheless the large surge current is undesirable. The large surge current may, for example, cause the pull-down transistor 35 to latch up, or may cause another device on the integrated circuit 9 to latch up. The large surge current may stress the pull-down transistor 35 so that the device is damaged over time with repeated use.

Each of the external discrete NFETs has an associated diode that helps solve the negative pulse voltage problems. These diodes are labeled with reference numerals 36-41 in FIG. 1. Consider, for example, diode 37 of external discrete NFET 17. If the inductive load being driven attempts to draw current from node 27 when both NFETs 16 and 17 are off, and if as a result the voltage on node 27 starts to spike negative, then diode 37 is to become conductive when the voltage on node 27 reaches −0.7 volts. A current can then flow from the ground conductor 29, through the forward biased diode 37, and to node 27. The diode 37 is to clamp the voltage on node 27 from going more negative than the forward voltage drop of diode 37, thereby protecting the pulldown LDMOS transistor 35 in high-side driver 10 from the effects of large negative voltage spikes.

SUMMARY

A power management integrated circuit includes a digital processor that executes a program of instructions, and also includes a plurality of high-side drivers and low-side drivers. The high-side and low-side drivers are organized in pairs, with each pair including one high-side driver and one low-side driver. Each high-side driver includes a P-channel lateral DMOS transistor (LDMOS) and an N-channel LDMOS transistor, where the drain of the P-channel transistor is coupled to the drain of the N-channel transistor and to a second terminal of the integrated circuit. The source of the P-channel transistor is coupled to a first terminal. The output lead of the high-side driver is coupled to the second terminal. The source of the N-channel transistor is coupled to a third terminal. The output lead of the low-side driver is coupled to a fourth terminal. The high-side driver can control an external discrete high-side NFET to be on or off by driving an appropriate control signal onto the second terminal and onto the gate of the external high-side NFET. Similarly, the low-side driver can control an external discrete low-side NFET to be on or off by driving an appropriate control signal onto the fourth terminal and onto the gate of the external low-side NFET.

In one specific motor control application, the third terminal associated with each pair of high-side and low-side drivers is coupled to a corresponding terminal of a motor. There may, for example, be three such motor terminals. There is one pair of high-side and low-side external discrete NFETs for each terminal of the motor. The processor of the power management integrated circuit monitors circuit, through an Analog-to-Digital Converter (ADC) and other interface circuitry, monitors operation of the motor. In response to the detected state of operation of the motor, the processor controls the high-side and low-side drivers to send appropriate control signals to the associated high-side and low-side external NFETs so that drive currents are supplied to the various terminals of the motor at the right times to drive the motor.

The N-channel lateral DMOS of each high-side driver is provided with an N type isolation structure and an associated tracking and clamping circuit. The N type isolation structure is disposed between the source, the gate, the drain, and the body of the N-channel lateral DMOS transistor and an underlying P type substrate. The tracking and clamping circuit couples the N type isolation structure to the drain such that when a voltage on the third terminal is substantially positive that a voltage Viso on the isolation structure tracks the voltage Vd on the drain. In this tracking mode, the tracking and clamping circuit provides a relatively low resistance (for example, less than 2k ohms) between the isolation structure and the drain.

The tracking and clamping circuit also couples the N type isolation structure to the drain such that when the voltage on the third terminal spikes to a substantially negative voltage, that Viso is clamped to be no more negative than a predetermined negative voltage. The predetermined negative voltage may, for example, be −0.7 volts. In this clamping mode, the tracking and clamping circuit provides a relatively high resistance (for example, more than 2k ohms) between the isolation structure and the drain. The relatively high resistance helps block a spike of surge current that would otherwise flow from the substrate and to the drain electrode when the voltage on the third terminal spikes negative. Preventing this spike of surge current from flowing through the N-channel lateral DMOS transistor of the high-side driver may prevent latchup, overstressing of the high-side driver circuit, and other problems.

An electrostatic discharge (ESD) protection circuit is provided between the third and fourth terminals. This ESD protection circuit is compatible with the operation of the isolation structure and tracking and clamping circuit. The ESD protection circuit conducts an ESD protection current between the first terminal and the third terminal if a voltage on the third terminal is above a predetermined positive voltage, or is below predetermined negative voltage, but the voltage on the third terminal can pulse negative without the ESD protection circuit conducting current. The ESD protection circuit does not conduct current if the voltage on the third terminal is below the predetermined positive voltage and is also above the predetermined negative voltage.

In one specific example, the voltage Viso of the isolation structure is clamped to about −0.7 volts during a negative voltage spike on the third terminal, the predetermined negative voltage on the third terminal below which the ESD protection circuit begins conducting an ESD protection current is approximately −10.0 volts, and the predetermined positive voltage on the third terminal above which the ESD protection circuit begins conducting an ESD protection current is approximately +60.0 volts. Accordingly, if the voltage on the third terminal is between +50.0 volts and −10.0 volts, then the ESD protection circuit does not conduct current. During driving of the motor, the voltage on the third terminal is allowed to spike negative down to −5.0 volts without a harmful spike of current flowing through the N-channel LDMOS of the high-side driver. The isolation structure and the tracking and clamping circuit together impede the spike of current, and as a result the current flows in another path outside the power management integrated circuit from a ground conductor, through the body diode of the external discrete low-side NFET, and to the terminal of the motor.

The foregoing is a summary and thus contains, by necessity, simplifications, generalizations and omissions of detail; consequently is it appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 5 is a circuit diagram of a motor control system involving an example of the MTPMIC.

FIG. 17 is a table that sets forth operation in the "tracking mode" illustrated in FIG. 15 and in the "clamping mode" illustrated in FIG. 16.

FIG. 18 is a circuit diagram of the ESD1 circuit of FIG. 6.

FIG. 19 is a circuit diagram of the ESD2 circuit of FIG. 6.

DETAILED DESCRIPTION

Figure 1:
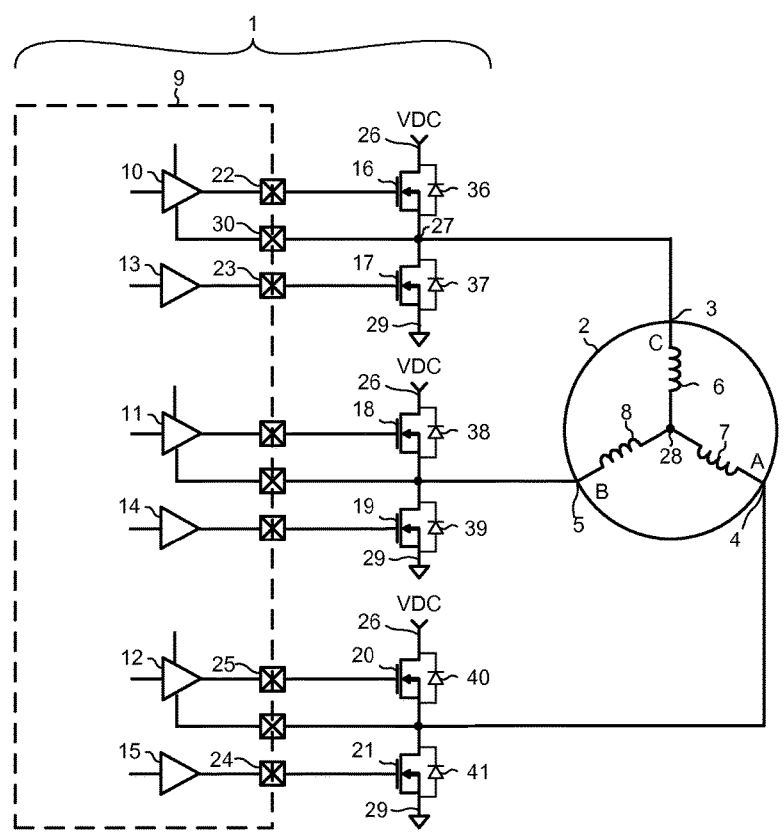
FIG. 1 (Prior Art) is a diagram of a conventional circuit that drives a motor.
Figure 2:
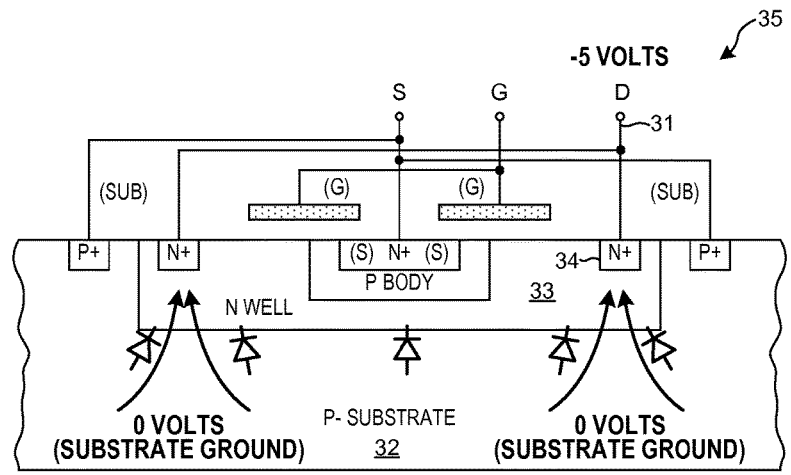
FIG. 2 (Prior Art) is a diagram that illustrates how a current might flow in the N-channel LDMOS transistor of the high-side driver of the circuit of FIG. 1.
Figure 3:
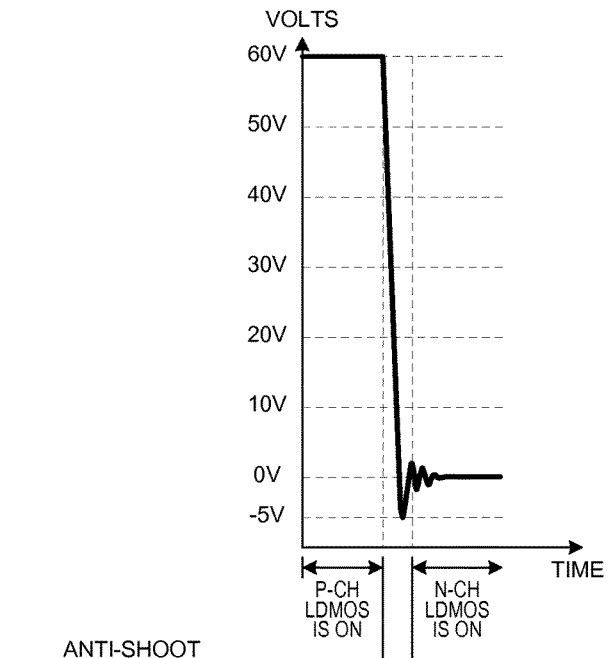
FIG. 3 (Prior Art) is a diagram that illustrates a negative voltage spike that might occur in the circuit of FIG. 1 if the body diodes were not present.
Figure 4:
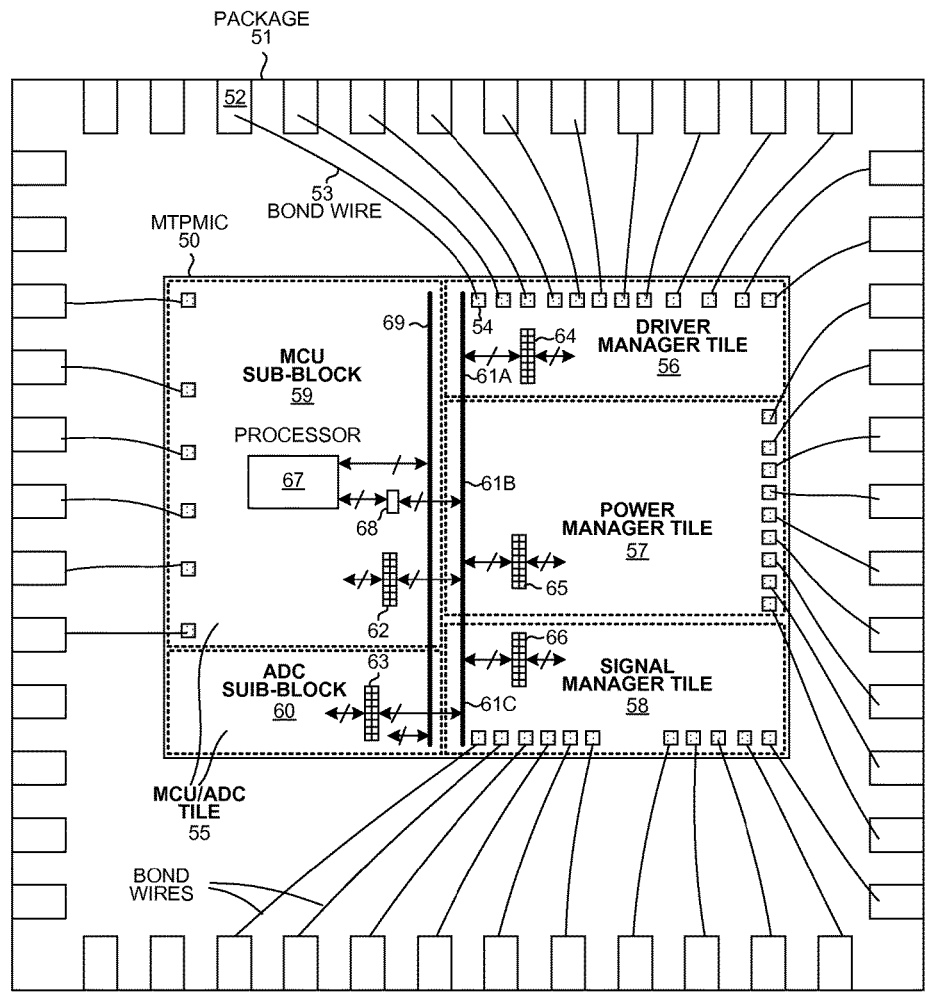
FIG. 4 is a simplified top-down conceptual diagram of a packaged Multi-Tile Power Management Integrated Circuit (MTPMIC) in accordance with one novel aspect.

FIG. 4 is a simplified top-down conceptual diagram of a packaged Multi-Tile Power Management Integrated Circuit (MTPMIC) 50 in accordance with one novel aspect. Integrated circuit package 51 includes a row of terminals on each on its four sides. One of the terminals at the upper side of the package is identified with reference numeral 52. MTPMIC 50 is the rectangular integrated circuit die within integrated circuit package 51. MTPMIC 50 includes terminals (also referred to as pads) disposed around the periphery of the MTPMIC chip 50 as illustrated. Each terminal of the MTPMIC 50 is coupled via a corresponding wire bond to a corresponding one of the terminals of the package 51. Reference numeral 53 identifies one such bond wire that couples terminal 52 of the package to a terminal 54 of MTPMIC 50.

MTPMIC 50 includes a plurality of Power Management Integrated Circuit (PMIC) tile portions. These PMIC tile portions include the MCU/ADC tile 55, a driver manager tile 56, a power manager tile 57, and a signal manager tile 58. The MCU/ADC tile 55 in turn includes an MCU (microcontroller unit) sub-block 59 and an Analog-to-Digital Converter (ADC) sub-block 60.

Each tile in the rightmost column has a bus portion of conductors capable of conducting digital signals, analog signals, and power signals. Bus portion 61A is the bus portion of driver manager tile 56. Bus portion 61B is the bus portion of power manager tile 57. Bus portion 61C is the bus portion of signal manager tile 58. The bus portions are disposed within each tile as illustrated so that if the tiles are appropriately arrayed in a column, then the bus portions of adjacent tiles line up with one another and form a standardized bus 61. In the illustrated example, the standardized bus 61 extends vertically along the left edge of the driver manager tile, vertically along the left edge of the power manager tile, and vertically along the left edge of the signal manager tile. The MCU/ADC tile 59 on the left interfaces to this standardized bus 61 in a standardized way using configuration registers 62 and 63. Each of the tiles in the right column also has such a configuration register coupled to the standardized bus. Configuration register 64 is the configuration register of driver manager tile 56. Configuration register 65 is the configuration register of power manager tile 57. Configuration register 66 is the configuration register of signal manager tile 58.

Each individual bit of each of these configuration registers may include a volatile cell and a non-volatile cell, or may simply involve a volatile cell such as in an ordinary processor-accessible register. If the configuration bit has a non-volatile cell, then on power up of MTPMIC 50 the data content of the non-volatile cell is automatically transferred to the volatile cell, and the data output of the volatile cell is then used to configure other circuitry in the tile. Individual ones of the configurations bits of these configuration registers can be written to, and read from, across the standardized bus.

A processor 67 within MCU/ADC tile 59 is the master of standardized bus 61. Through a bus interface 68, this processor 67 can write to any of the configuration registers in any of the tiles across the standardized bus. By writing across standardized bus 61, the processor 67 configures each of the other tiles in an appropriate way for the particular application to which MTPMIC 50 is being put. In addition to the standardized bus 61, MTPMIC 50 also includes a processor local bus 69. Various circuits in MCU sub-block 59 and in ADC sub-block 60 are coupled to this processor local bus 69. Processor 67 can read from and write to these various circuits across the processor local bus 69.

For additional information on the MTPMIC, the tile architecture, the standardized bus, and its associated configuration registers, see: 1) U.S. patent application Ser. No. 13/315,282, entitled "Power Manager Tile For Multi-Tile Power Management Integrated Circuit", filed Dec. 8, 2011, by Steven Huynh; 2) U.S. patent application Ser. No. 11/978,458, entitled "Microbump Function Assignment In A Buck Converter", filed Oct. 29, 2007, by Huynh et al.; 3) U.S. patent Ser. No. 11/544,876, entitled "Method and System for the Modular Design and Layout of Integrated Circuits", filed Oct. 7, 2006, by Huynh et al.; 4) U.S. provisional application 60/850,359, entitled "Single-Poly EEPROM Structure For Bit-Wise Write/Overwrite", filed Oct. 7, 2006; 5) U.S. patent application Ser. No. 11/888,441, entitled "Memory Structure Capable of Bit-Wise Write or Overwrite", filed Jul. 31, 2007, by Grant et al.; and 6) U.S. patent application Ser. No. 11/978,319, entitled "Interconnect Layer of a Modularly Designed Analog Integrated Circuit", filed Oct. 29, 2007, by Huynh et al; 7) U.S. patent application Ser. No. 11/452,713, entitled "System for a Scaleable and Programmable Power Management Integrated Circuit", filed Jun. 13, 2006, by Huynh; 8) U.S. provisional application Ser. No. 60/691,721, entitled "System for a Scaleable and Programmable Power Management Integrated Circuit", filed Jun. 16, 2005, by Huynh; and 9) U.S. patent application Ser. No. 12/322,375, filed Jun. 30, 2009 (the entire subject matter of each of these patent documents is incorporated herein by reference).

FIG. 5 is a circuit diagram of a motor control system 80 involving one specific example of MTPMIC 81. In the example of FIG. 5, a power manager tile 82 forms the upper left corner of MTPMIC 81. A MCU/ADC tile 83 forms the lower left corner of MTPMIC 81. A driver manager tile 84 forms the upper right corner of MTPMIC 81. A signal manager tile 85 forms the lower right corner of MTPMIC 81. A key showing how FIGS. 5A, 5B, 5C and 5D fit together in this way is provided at the bottom left of FIG. 5A.

The power manager tile 82 and the external circuitry 86-97 are configured to form a step down buck converter power supply. The voltage VIN on conductor 98 is a +48 volt DC supply voltage as provided by battery 86. Battery 86 is a +48 volt multi-cell lead acid battery. The NPN bipolar transistor 88 drives an inductor 91 in the step-down configuration, which generates a main 12 volt supply voltage VP on node 99 and terminal VP 100. Resistor 92 is a current sense resistor. It is coupled between terminal CSM 101 and terminal VP 100. Capacitor 93 is the main storage capacitor of the power supply. The +12 volt voltage VP generated by the power manager tile is used to supply power to the external switching circuitry 120-140 that drives an external motor 141. The +12 volt supply voltage VP is also converted by a linear regulator 102 into a +5 volt supply voltage VSYS. Supply voltage VSYS is in turn converted into other supply voltages VVDA, VVDIO and VCORE by linear regulators 103, 104 and 105, respectively. The supply voltage VSYS is also made available for use by off-chip components via terminal 106.

Figure 5A:
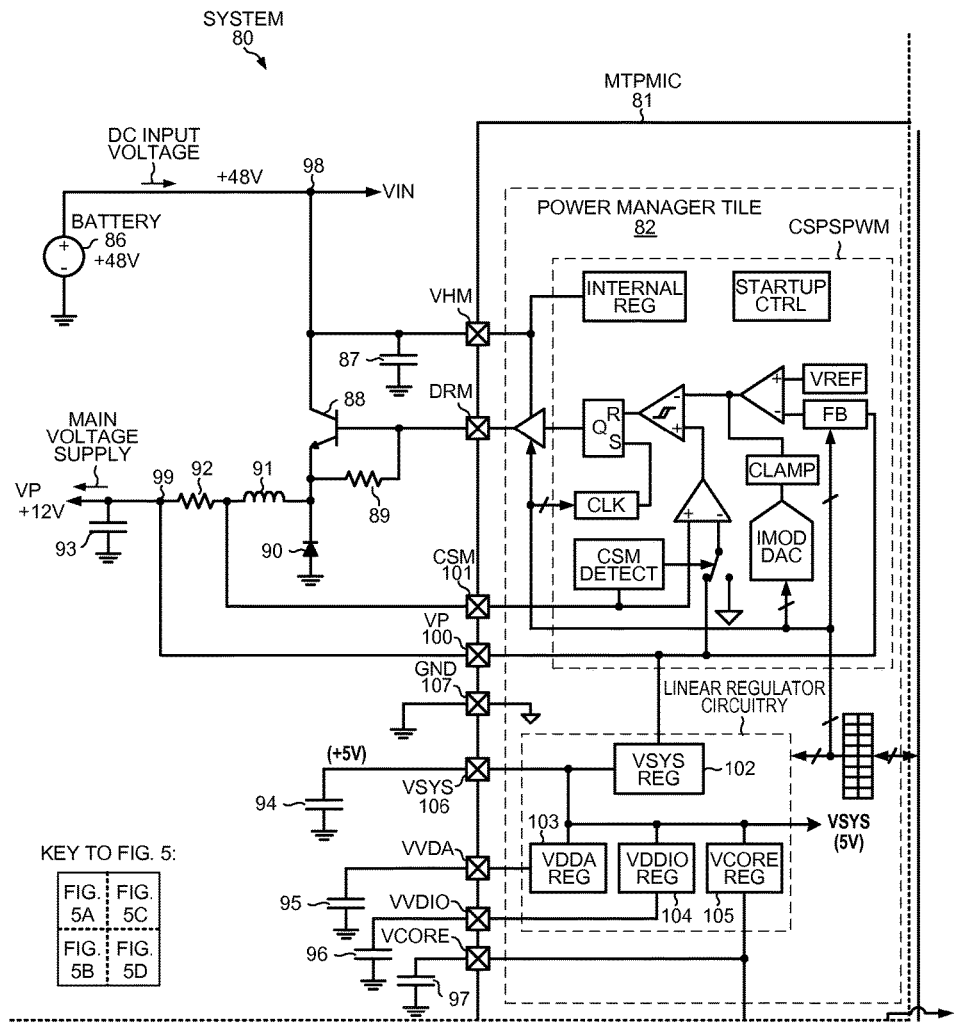
FIGS. 5A, 5B, 5C and 5D are diagrams that together form FIG. 5.
Figure 5B:
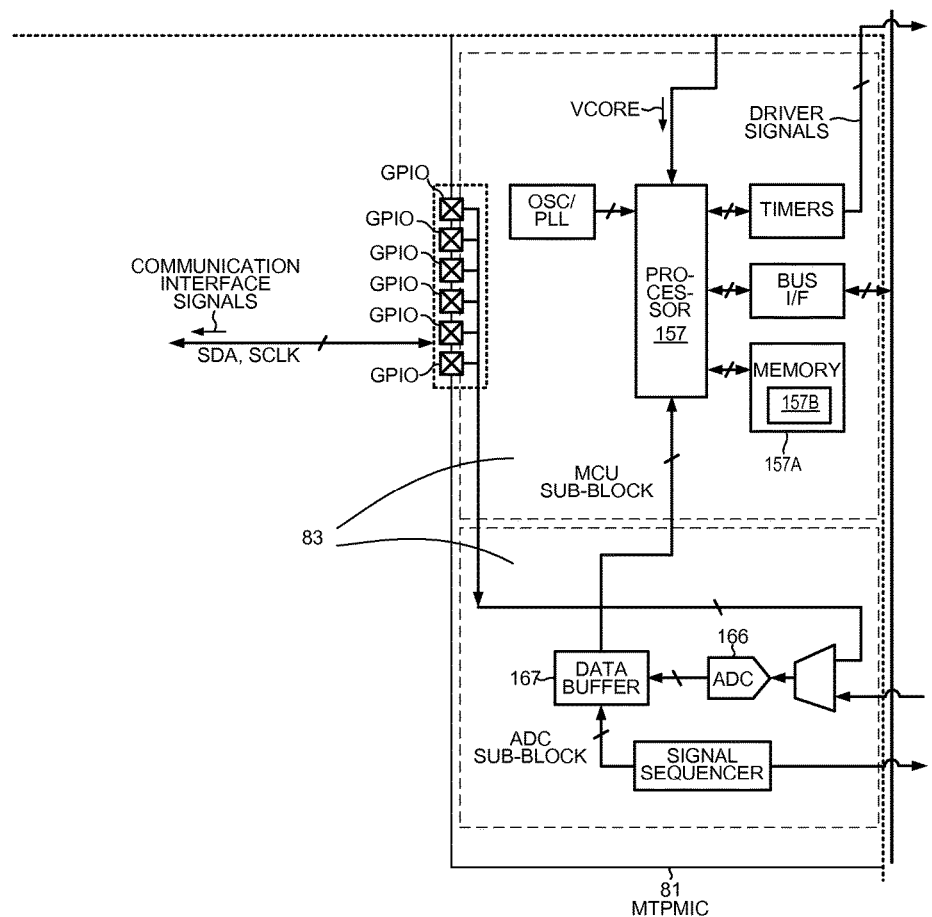
Figure 5C:
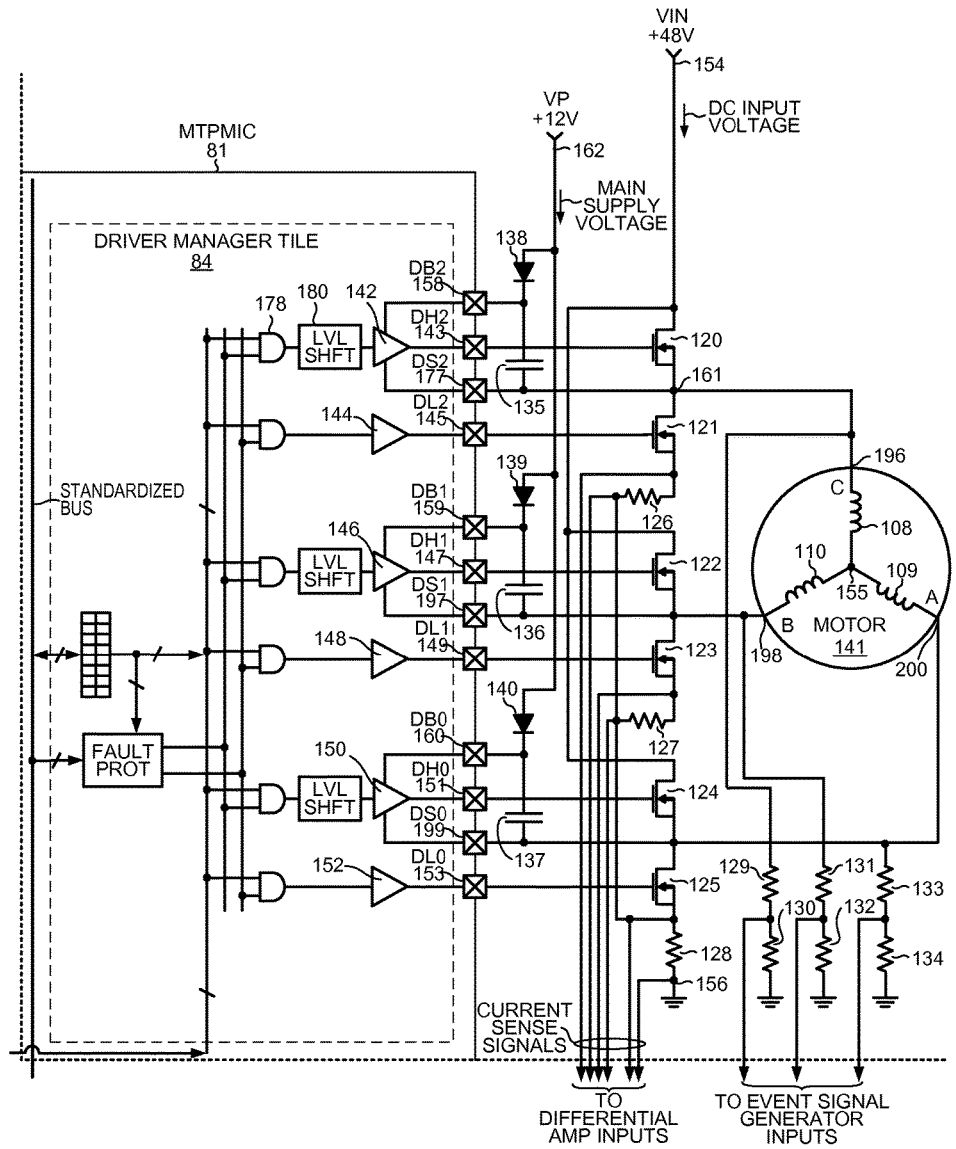
Figure 5D:
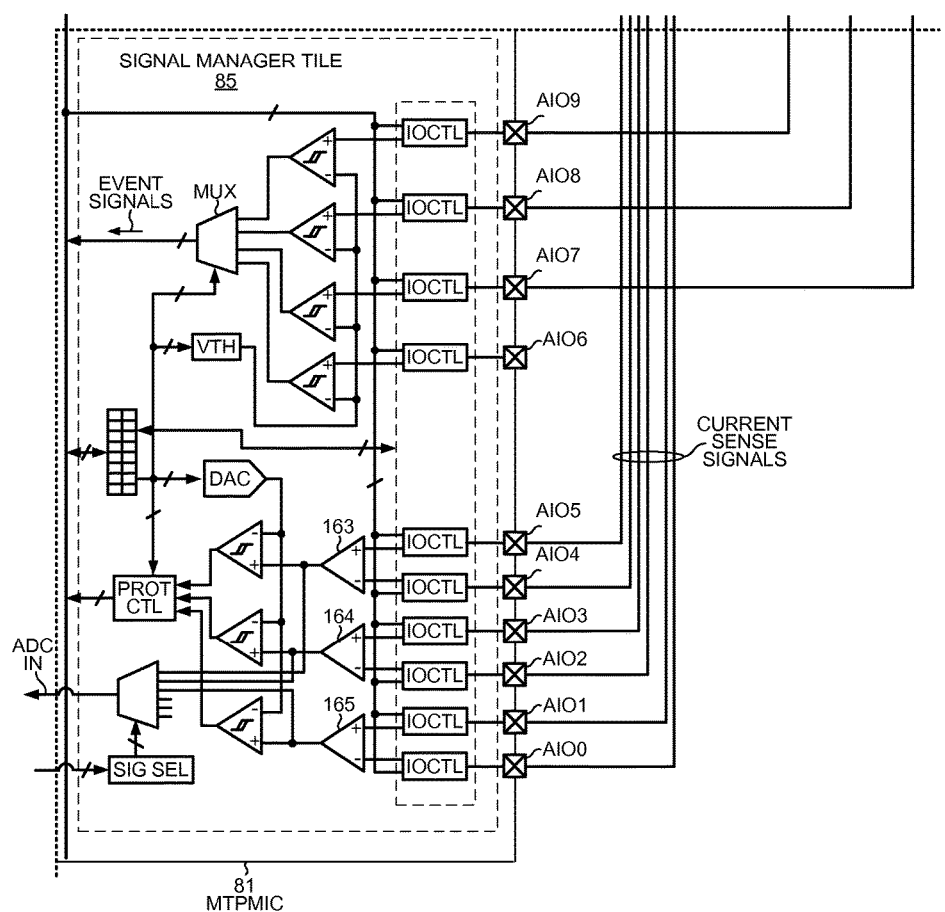

Each of the three windings 108-110 of motor 141 is coupled to a corresponding pair of external discrete NFETs as illustrated in FIG. 5C. Each pair of discrete NFETs includes a high-side discrete NFET and a low-side discrete NFET. The high-side NFETS are 120, 122 and 124. The low-side NFETs are 121, 123 and 125. High-side driver 142 within MTPMIC 81 controls the external high-side discrete NFET 120 by driving a control signal HS2 out of terminal 143. Low-side driver 144 within MTPMIC 81 controls the external low-side NFET 121 by driving a control signal LS2 out of terminal 145. High-side driver 146 controls high-side NFET 122 by driving a control signal HS1 out of terminal 147. Low-side driver 148 controls low-side NFET 123 by driving a control signal LS1 out of terminal 149. High-side driver 150 controls high-side NFET 124 by driving a control signal HS0 out of terminal 151. Low-side driver 152 controls low-side NFET 125 by driving a control signal LS0 out of terminal 153.

Current flow through motor 141 involves current flow from the +48 volt VIN conductor 154, through a selected one of the high-side discrete NFETs, through one winding, to center node 155 of the motor, and from the center node 155 of the motor through another winding, and then through a selected one of low-side discrete NFETs, and through one or more current sense resistors to ground node and ground conductor 156. VIN conductor 154 is part of VIN node 98 of FIG. 5A. GND conductor 156 is coupled to GND terminal 107 of FIG. 5A. The processor 157 of the MCU/ADC tile 83 executes a program 157B of processor-executable instructions stored in memory 157A. As a result of execution of this program 157B, processor 157 monitors operation of motor 141 through signal manager tile 85, and communicates control information to the high-side drivers and the low-side drivers of driver manager tile 84, thereby controlling the high-side driver and the low-side drivers to turn off and on selected ones of their associated external discrete NFETs 120-125 at appropriate times so that currents flow through the windings of the motor as appropriate to drive motor 141.

Each high-side driver is coupled to a charging diode and a bootstrap capacitor as illustrated. The charging diodes are diodes 138, 139 and 140. The bootstrap capacitors are capacitors 135, 136 and 137. A gate voltage higher than the +48 volt VIN voltage on conductor 154 is required to keep a high-side NFET on and conductive. The bootstrap capacitors are coupled to provide about +59.3 volts onto the terminals 158, 159 and 160. This +59.3 volts present on terminals 158, 159 and 160 allows the high-side drivers 142, 146 and 150 to drive the gates of high-side NFETs to +59.3 volts to turn these high-side NFETs on.

Consider for example bootstrap capacitor 135. When the associated low-side NFET 121 is on and conductive, the voltage on node 161 is pulled down to ground potential. Bootstrap capacitor 135 is therefore charged to +11.3 volts by a current flowing from VP conductor 162, through a forward biased diode 138, and through bootstrap capacitor 135, to ground potential on node 161. VP conductor 162 is part of VP node 99 of FIG. 5A. When the low-side NFET 121 is later turned off and node 161 is then pulled down to ground potential, the charged bootstrap capacitor 135 puts a +11.3 volt voltage potential relative to node 161 on terminal 158. If the high-side driver 142 is then to turn external high-side NFET 120 on, the high-side driver 142 uses this +11.3 volt potential on terminal 158 relative to node 161 as a supply voltage to drive a digital high voltage control signal of 11.3 volts relative to node 161 onto the gate of external NFET 120. Due to the periodic switching on and off of the low-side NFET 121, bootstrap capacitor 135 can be maintained in a charged state throughout the switching on and off of the externals NFETs 120 and 121 as the motor is being driven. For more information on operation of the bootstrap capacitors, see: U.S. patent application Ser. No. 13/315,282, entitled "Power Manager Tile For Multi-Tile Power Management Integrated Circuit", filed Dec. 8, 2011, by Steven Huynh (the entire subject matter of which is incorporated herein by reference).

Resistors 126, 127 and 128 are current sense resistors. Differential amplifiers 163-165 of the signal manager tile 85 are coupled so that they can measure and monitor the voltage drops across the three current sense resistors 126, 127 and 128. The outputs of the differential amplifiers 163-165 are converted into corresponding digital values by ADC 166. The resulting digital values are indicative of the magnitudes of the voltage drops across the current sense resistors. Processor 157 of the MCU/ADC tile 83 reads these digital values from data buffers 167 and based on the digital values and other information determines how to control the high-side and low-side drivers.

Figure 6:
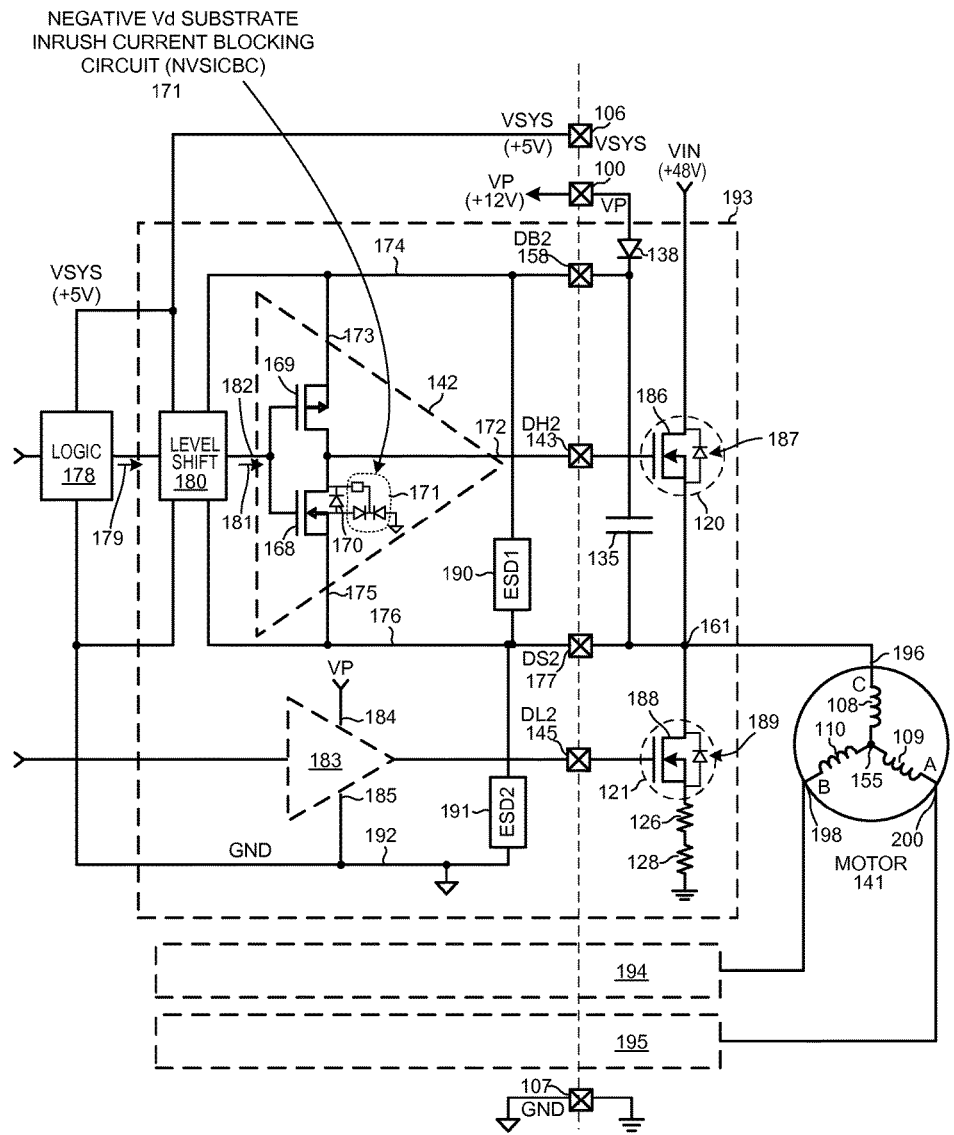
FIG. 6 is a more detailed circuit diagram of one high-side driver/low-side driver pair within the MTPMIC of FIG. 5.

FIG. 6 is a more detailed circuit diagram of one pair of high-side and low-side drivers and the associated high-side and low-side external NFETs. High-side driver 142 includes an N-channel Lateral Double-diffused Metal Oxide Semiconductor (LDMOS) transistor 168, a P-channel LDMOS transistor 169, a diode 170, and a "negative VD substrate inrush current blocking circuit" (NVSICBC) 171. As described in further detail below, NVSICBC 171 includes an isolation structure and an associated tracking and clamping circuit. The P-channel and N-channel LDMOS transistors 169 and 168 are interconnected as a complementary logic inverter. The output 172 of the inverter is coupled via terminal 143 to the gate of external discrete NFET 120. Supply voltage lead 173 of the high-side driver 142 is coupled to supply voltage conductor 174 and terminal 158. Ground voltage lead 175 of the high-side driver 142 is coupled to floating source voltage conductor 176 and to terminal 177. To turn external high-side discrete NFET 120 on, high-side driver 142 drives the voltage on conductor 174 onto terminal 143 and onto the gate of NFET 120. To turn external high-side discrete NFET 120 off, high-side driver 142 drives the voltage on conductor 176 onto terminal 143 and onto the gate of NFET 120.

Block 178 represents digital logic that supplies a digital logic control signal 179 to turn on or to turn off the external discrete NFET 120. Processor 157 controls block 178 by controlling the digital input signal to block 178. The digital logic high potential for block 178 is the supply voltage VSYS on VSYS terminal 106 of FIG. 5A. The digital logic low potential for block 178 is ground potential GND received onto MTPMIC 81 via terminal 107 of FIG. 5A.

Block 180 represents a level shift circuit that receives the digital logic control signal 179 from logic 178 and level shifts the signal so that it is output as a digital logic control signal 181 onto the input lead 182 of the high-side driver 142. The digital logic control signal 181 swings between a digital high voltage level of the voltage on conductor 174 and a digital low voltage level of the voltage on conductor 176.

Low-side driver 183 controls external discrete NFET 121 via terminal 145. To turn external NFET 121 on, low-side driver 183 drives the VP voltage on lead 184 onto terminal 145 and onto the gate of NFET 121. To turn external NFET 121 off, low-side driver 183 drives the voltage on lead 185 onto terminal 145 and onto the gate of NFET 121.

External discrete NFET device 120 includes an N-channel NFET 186 as well as its own parasitic body diode 187. NFET 186 (and its body diode 187) is packaged in its own IC package. Devices 186 and 187 may be generally referred to together as a transistor.

External discrete NFET device 121 includes an N-channel NFET 188 as well as its own parasitic body diode 189. NFET 188 (and its body diode 189) is packaged in its own IC package. Devices 188 and 189 may be generally referred to together as a transistor.

A first electrostatic discharge protection circuit (ESD1) 190 is coupled between conductor 176 and conductor 174. This ESD protection circuit 190 conducts an ESD current if the voltage between conductors 174 and 176 is more positive than approximately +20.0 volts (+60.0 volts on 174 relative to ground potential on 192), or if the voltage between conductors 174 and 176 is more negative than approximately −0.7 volts.

A second electrostatic discharge protection circuit (ESD2) 191 is coupled between ground conductor 176 and conductor 192. This ESD protection circuit 191 conducts an ESD current if the voltage between conductors 176 and 192 is more positive than +60.0 volts, or if the voltage between conductors 176 and 192 is more negative than approximately −10.0 volts. Conventionally, an ESD circuit protecting a floating source terminal of a high-side driver may begin to conduct an ESD protection current if the voltage on the terminal is more negative than about −0.7 volts, but in the case of the circuit of FIG. 6 the ESD protection circuit 191 does not conduct an ESD current for such small negative voltages on terminal 177.

Dashed block 193 represents the first pair of high-side and low-side drivers 142 and 183 and the associated discrete NFET circuitry and terminals. Dashed block 194 represents the second pair of high-side and low-side drivers 146 and 148 and the associated discrete NFET circuitry and terminals. Dashed block 195 represents the third pair of high-side and low-side drivers 150 and 152 and the associated discrete NFET circuitry and terminals.

Terminal 177 of MTPMIC 81 is coupled to motor terminal 196. Likewise, terminal 197 of MTPMIC 81 is coupled to motor terminal 198, and terminal 199 of MTPMIC 81 is coupled to motor terminal 200.

Figure 7:
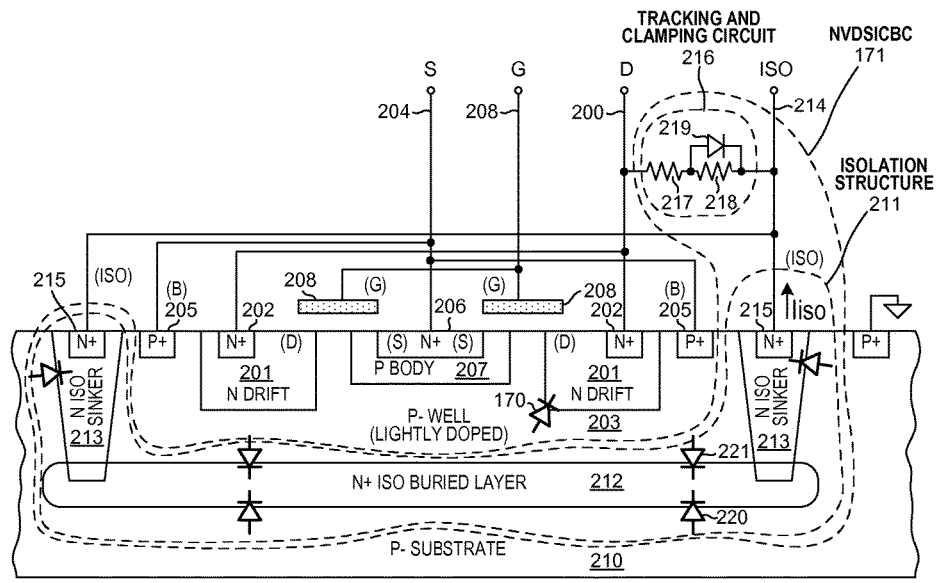
FIG. 7 is a simplified cross-sectional diagram of the N-channel LDMOS transistor of the high-side driver of FIG. 6, with its associated isolation structure and tracking and clamping circuit.

FIG. 7 is a simplified cross-sectional diagram of the N-channel LDMOS transistor 168 of FIG. 6, of diode 170, and of the NVSICBC 171. A drain electrode D 200 makes electrical contact with drain and N drift region 201 via an N+ contact region 202. The N drift region 202 extends down into a lightly doped P−well 203. A source electrode S 204 makes electrical contact with the P type body 207 and P-well 203 via a P+ contact region 205 and P+ type contact regions 293 and 294. Source electrode S 204 also makes electrical contact with a centrally located N+ source region 206. P type body region 207 extends down into the lightly doped P− type well region 203 as shown. N+ type source region 206 extends down into the P− type body region 207 as shown.

Although it appears in the cross-sectional view of FIG. 7 that there are two drain and N drift regions, one on either side of the centrally located P type body region 207 and the centrally located N+ type source region 206, the view of FIG. 7 is a cross-sectional view and the like-regions are electrically connected in a large inter-digitated structure for the single LDMOS transistor. Various ones of the finger-shaped structures of the inter-digitated structure are interconnected electrically by bridging metal connections.

Block structure 208 represents two cross-sectional portions two finger-shaped interconnected strips of a polysilicon gate electrode. Gate electrode 208 is disposed above a channel forming region of the P body region and the P− type well region between the N+ type source region 206 and the drain and N drift regions 201.

The lightly doped P− type well region 203 is isolated from the P− type substrate 210 by an N type isolation structure 211. N type isolation structure 211 includes an N+ type buried layer 212 and an N type isolation sinker 213. Although it appears that there are two N type isolation sinkers in the cross-sectional view of FIG. 7, the isolation sinker is typically a single ring-shaped structure that surrounds an array comprising the gate, source and drain structures of the transistor when the transistor structure is considered from the top-down perspective. The N type isolation sinker 213 and the underlying N+ type isolation buried layer 212 contact one another to form the isolation structure 211. The P− type well region 203 is entirely separated from the P− type substrate 210 by the isolation structure 211. An isolation electrode ISO 214 makes electrical contact to the N type isolation sinker 213 via an N+ type contact region 215. The electrode and contact structure shown in FIG. 7 is a simplification made to facilitate understanding of the connectivity of the electrodes to the structures of the transistor. How the electrodes are formed and how the electrodes make contact with the semiconductor material of a LDMOS structure is understood by those of ordinary skill in art and is therefore not explained further here. There are several well-known suitable variations of how the structures can be formed and interconnected and provided with contacts and electrodes.

A tracking and clamping circuit 216 has a first lead that is coupled to the drain electrode 200 and has a second lead that is coupled to the ISO electrode 214. In the illustrated example, the tracking and clamping circuit 216 includes a first resistor 217 of a relatively low resistance (<2k ohms such as, for example, 500 ohm), a second resistor 218 of a relatively high resistance (>2k ohms such as, for example, 10k ohm), and a diode 219, interconnected as shown. Although depicted here schematically, the tracking and clamping circuit 216 is integrally formed as part of the MTPMIC integrated circuit.

In a tracking mode, if the voltage Vd on the drain electrode 200 is adequately positive (with respect to the voltage Vsub of substrate 210) then the diode 219 is forward biased and conductive and the resistance provided by tracking and clamping circuit 216 between electrodes 200 and 211 is relatively small (for example, about 500 ohms). This relatively small resistance allows the voltage Viso on the isolation structure 211 to track the voltage Vd on the drain electrode 200.

In a clamping mode, if the voltage Vd is negative (with respect to the voltage Vsub on substrate 210) then the diode 219 is reverse biased and non conductive and the resistance provided by the tracking and clamping circuit 216 between electrodes 200 and 211 is relatively large (for example, about 10k ohms). The voltage Viso of the N+ type isolation buried layer 212 is clamped so that it becomes approximately −0.7 volts with respect to Vsub. Due to Viso being clamped at −0.7 volts, the voltage Vd on the N type drift region 201 and on the P− type well region 203 can be more negative than −0.7 volts. Even if the voltage Vd is as low as −5.0 volts during a transient dead time condition, there is not a substantial inrush of current from the substrate 210 to the drain electrode 200 due to the blocking effect of the relatively high resistance of the tracking and clamping circuit 216.

Figure 8:
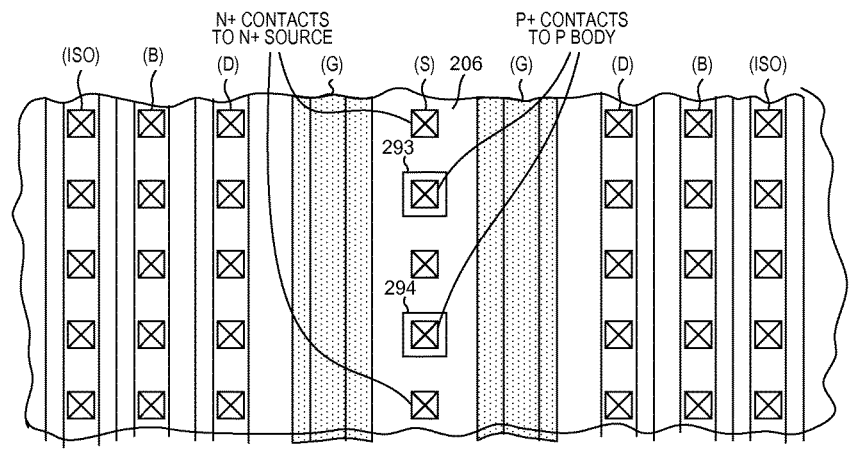
FIG. 8 is a simplified top-down diagram of a part of the N-channel LDMOS transistor of FIG. 7.

FIG. 8 is a simplified top-down diagram of a part of the N-channel LDMOS structure of FIG. 7. The transistor structure of FIG. 7 is laid out to have a long elongated form. The portion of the transistor structure shown in FIG. 8 is but a section of the elongated form. In the diagram of FIG. 8, the elongated direction is the vertical direction on the page. As explained above in connection with FIG. 7, the centrally located N+ type source region 206 is inter-digitated with the other structures of the transistor that have the general form of an LDMOS transistor array.

Figure 9:
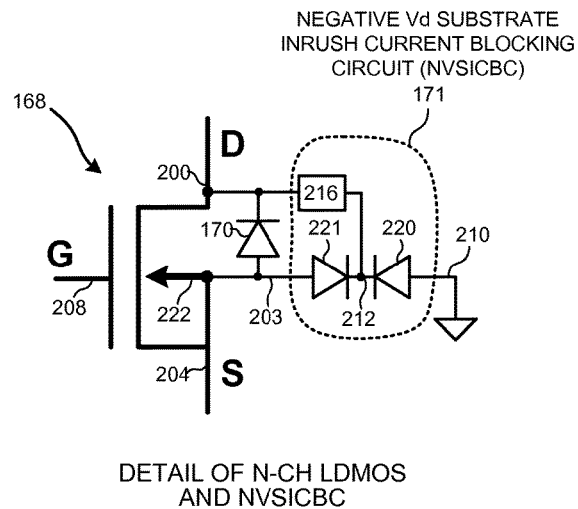
FIG. 9 is schematic diagram of the N-channel LDMOS transistor of the high-side driver of FIG. 6, with its associated isolation structure and tracking and clamping circuit.

FIG. 9 is schematic diagram of N-channel LDMOS transistor 168, of diode 170, and of the negative Vd substrate inrush current blocking circuit (NVSICBC) 171. NVSICBC 171 includes the isolation structure 211 and the tracking and clamping circuit 216. Diode symbol 170 represents the PN junction between the P− type well region 203 and the N type drift region 201. Diode symbol 220 represents a PN junction between the P− type substrate 210 and the N+ type buried isolation layer 212. Diode symbol 221 represents PN junction between P− type well 203 and the N+ type buried isolation layer 212. The current blocking circuit 216 is represented by the block. The ground symbol identified by reference numeral 210 represents the P− type substrate. The node identified by reference numeral 212 represents the N+ type isolation buried layer. The transistor symbol on the left of the diagram is a traditional symbol for an N-channel field effect transistor. The source electrode of transistor 168 is identified by reference numeral 204. The drain electrode of N-channel LDMOS transistor 168 is identified by reference numeral 200. The gate electrode of N-channel LDMOS transistor 168 is identified by reference numeral 208. The inward pointing arrow 222 represents the PN junction between the P body 207 and the N-type channel that would form under the gate electrode if the transistor were on and conductive.

Figure 10:
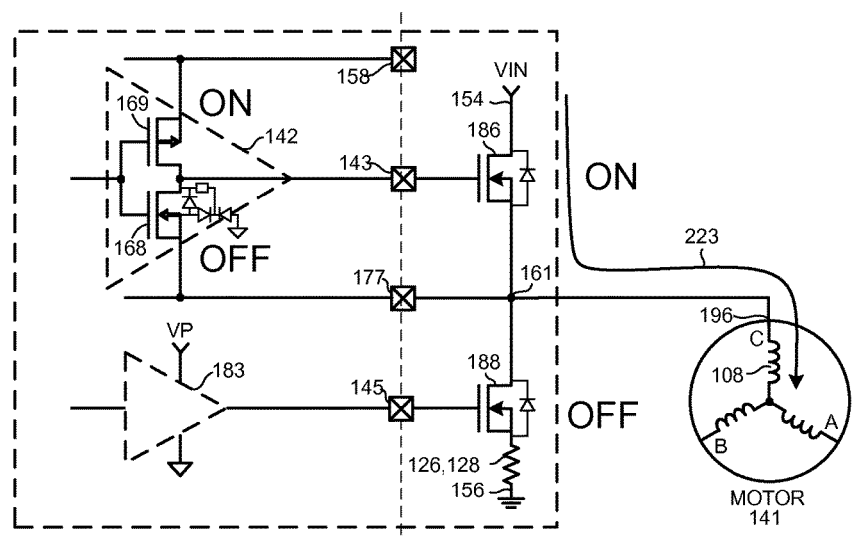
FIGS. 10, 11 and 12 are three diagrams that illustrate a sequence of operation of the circuit of FIG. 6.
Figure 11:
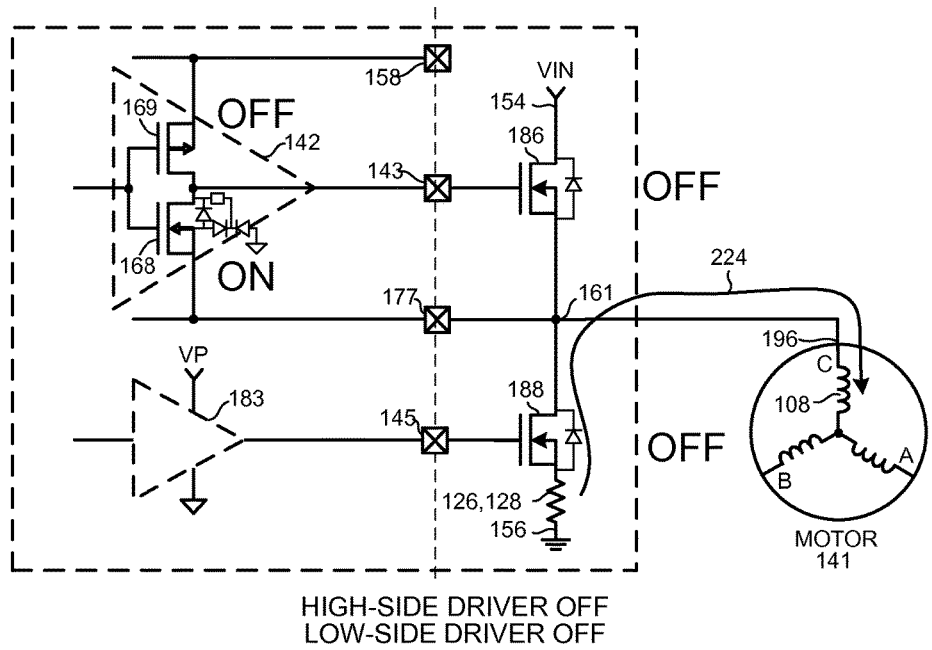
Figure 12:
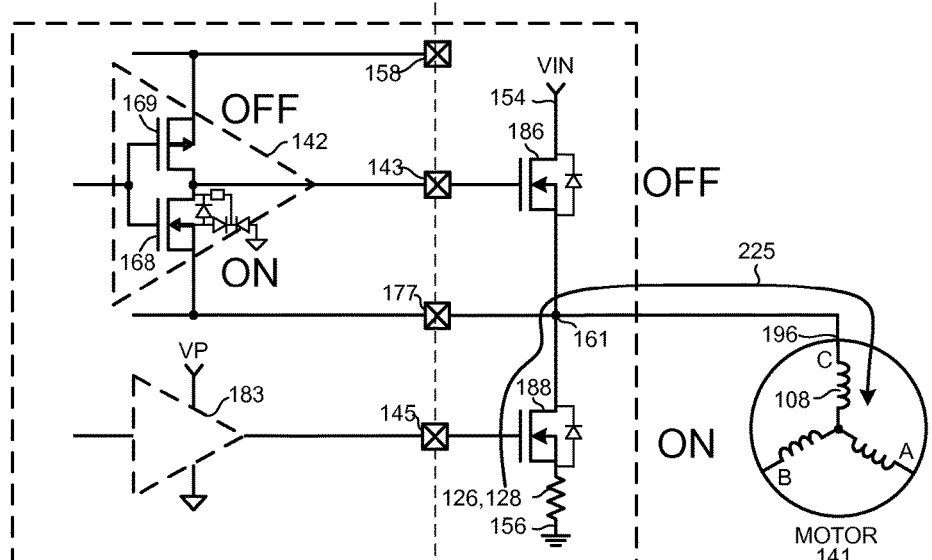

FIGS. 10, 11 and 12 illustrate a sequence in an operation of the motor control system 80 of FIG. 5. In a first period of time illustrated in FIG. 10, high-side driver 142 controls high-side discrete NFET 186 to be on and conductive. Low-side driver 183 controls low-side discrete NFET 188 to be off and nonconductive. The P-channel LDMOS transistor 169 of the high-side driver is on, and the N-channel LDMOS transistor 168 of the high-side driver is off. A current 223 flows from VIN supply voltage conductor 154, through conductive discrete NFET 186, through node 161, into the motor terminal 196, through the motor winding 108 as illustrated. The voltage on node 161 in this example is approximately +48.0 volts (relative to substrate ground potential).

After an amount of time has elapsed or a condition has been met, it is desired to stop the flow of current 223 from supply voltage conductor VIN into motor terminal 196 and to couple motor terminal 196 to ground conductor 156. High-side driver 142 therefore controls external discrete high-side NFET 186 to be turned off. P-channel LDMOS transistor 169 of the high-side driver is off, and the N-channel LDMOS transistor 168 of the high-side driver is on. This is the situation illustrated in FIG. 11. For a brief amount of time referred to as the "anti-shoot through dead time", both discrete NFETs 186 and 188 are off and nonconductive. Despite that fact that both NFETs 186 and 188 are controlled to be off, energy stored in the inductance of winding 108 will result in a current draw from node 161, and this current draw causes the voltage on node 161 to pulse negative. A negative voltage pulse is therefore present on the source electrode 204 of N-channel LDMOS transistor 168 due to the source electrode 204 being coupled to node 161 and to conductor 176. The pulsing negative of the voltage on source electrode 204 is generally not a serious problem, however, due to the relatively highly doped P body region 207 that surrounds the N+ source region 206. The heavy doping of P body region 207 and extra separation afforded by the P− type well region 203 together prevent punch through from the N+ type source region 206 to the N+ type buried isolation layer 212.

Due to the N-channel LDMOS transistor 168 being on and conductive in the situation of FIG. 11, however, the negative voltage pulse on source region 206 is coupled through the channel region of the transistor to the drain electrode 200. The N+ type contact 202 and N− type drift region 201 is more susceptible to punch through problems when the drain electrode 200 pulses negative. Only a relatively lightly doped amount of P− type well region 203 separates the N− type drift region 201 from the N+ type buried isolation layer 212 and from the N+ type isolation sinker region 213. In FIG. 11, the arrow 224 representing current flow into motor terminal 196 is a simplification. Details of the current flow are explained in further detail below in connection with FIG. 16. The voltage on node 161, and therefore on the source electrode 204, and therefore on the drain electrode 200, spikes downward from +48.0 volts to a negative voltage that may, for example, spike as low as −5.0 volts.

Next, as illustrated in FIG. 12, low-side driver 183 controls the discrete low-side NFET 188 to be turned on and conductive. P-channel LDMOS 169 remains off and N-channel LDMOS 168 remains on. This condition causes the voltage on node 161 to stabilize at zero volts (relative to substrate ground potential). The direction of current flow 225 does not, however, immediately reverse but rather continues in the direction illustrated for an amount until the direction of current flow can reverse. The situation illustrated in FIG. 12 represents an instant in time immediately after the low-side NFET 188 has been turned on.

Figure 13:
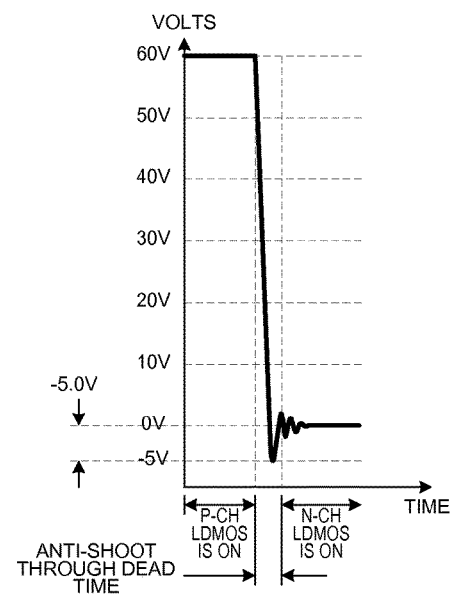
FIG. 13 is a waveform diagram of the voltage Vd (relative to substrate ground Vsub) of the drain of the transistor structure of FIG. 7.

FIG. 13 is a waveform diagram of the voltage Vd on node 161, on drain electrode 200, and on source electrode 204 relative to substrate ground Vsub. During the dead time, the voltage Vd on node 161, on drain electrode 200, and on source electrode 204 reaches approximately −5.0 volts.

Figure 14:
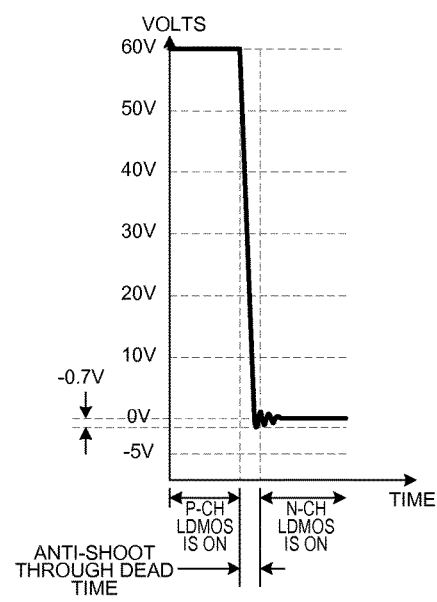
FIG. 14 is a waveform diagram of the voltage Viso (relative to substrate ground Vsub) of the isolation structure of the transistor structure of FIG. 7.

FIG. 14 is a waveform diagram of the voltage Viso on the isolation structure 211 relative to substrate ground Vsub. During the dead time, the voltage Viso on the buried layer 212 decreases to −0.7 volts but is clamped at about −0.7 volts due to the forward biasing of the PN junction between P type substrate 210 and the N+ type buried layer 212.

Figure 15:
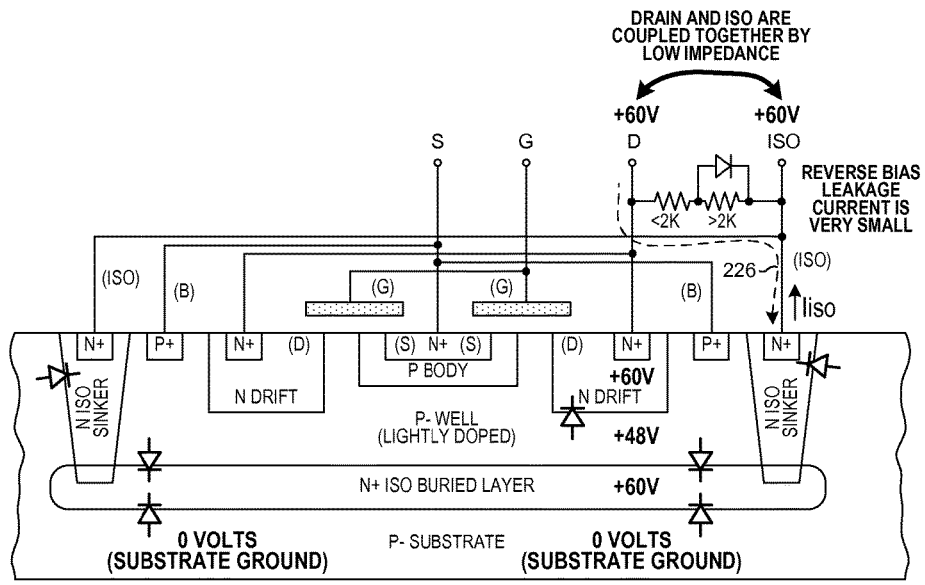
FIG. 15 is a simplified cross-sectional diagram that illustrates operation of the transistor structure of FIG. 7 in the tracking mode.

FIG. 15 is a diagram that shows operation of NVSICBC 171 in the normal operating condition in which a negative voltage (with respect to the voltage Vsub on substrate 210) is not present on node 161. The voltage Vd on the drain electrode is positive with respect to substrate voltage Vsub, consequently the tracking and clamping circuit 216 provides the relatively low resistance (for example, about 500 ohms), thereby effectively coupling the isolation structure 211 to the drain electrode 200. This allows the voltage Viso on the isolation structure to track changes in the voltage Vd on the drain electrode. In the illustrated example, the voltage Vd on the drain electrode is +60.0 volts and the voltage Viso on the isolation structure has tracked that voltage (due to the relatively low resistance of the tracking and current blocking circuit 216) so that the voltage Viso is approximately +60.0 volts as well. The PN junction between P− type substrate 210 and N+ type buried layer 212 is reverse biased. The PN junction between P− type well 203 and N+ type buried layer 212 is also reverse biased. In this condition, only a very little reverse bias leakage current 226 flows from the drain electrode 200, through the tracking and clamping circuit 216, through the isolation structure 211, and to the substrate. FIG. 15 illustrates current flow through the isolation structure of N-channel LDMOS transistor 168 in the situation depicted in FIG. 10.

Figure 16:
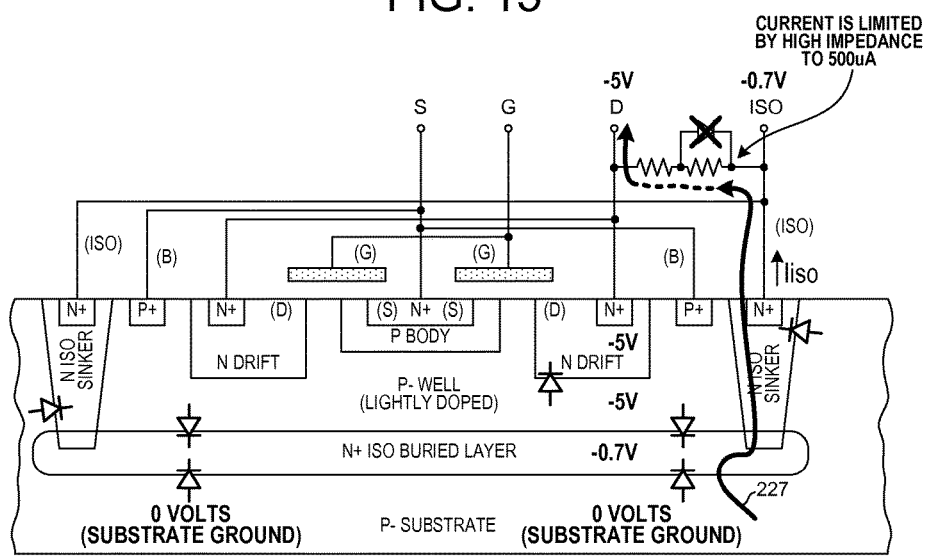
FIG. 16 is a simplified cross-sectional diagram that illustrates operation of the transistor structure of FIG. 7 in the clamping mode.

FIG. 16 is a diagram that shows operation of NVSICBC 171 in the negative pulse transient condition in which a negative voltage pulse appears on node 161 during the dead time depicted in FIG. 11. When the voltage Vd on the drain electrode 200 falls negative (with respect to the voltage Vsub on substrate 210), the diode 219 of the tracking and clamping circuit 216 becomes reverse biased. The tracking and clamping circuit 216 therefore provides a relatively large resistance (for example, 10k ohms) between isolation structure 211 and drain electrode 200. This effectively blocks what would otherwise be a potentially large surge of current 227 from flowing from substrate 210 to drain electrode 200. The voltages on the P− type well region 203 and on the N− type drift region 201 are allowed to go negative along with the voltage Vd on the drain electrode without there being a large surge of current through the transistor structure from the substrate to the drain electrode.

FIG. 17 is a table that illustrates operation in the "tracking mode" illustrated in FIG. 15 and in the "clamping mode" illustrated in FIG. 16. In the tracking mode, if Vd is raised with respect to Viso, then Viso rises and tracks the rise in Vd due to the relatively low resistance through the tracking and clamping circuit 216 when diode 219 is forward biased. Even after Viso has increased to the point that diode 219 is no longer strongly forward biased, Viso may continue to rise until it matches Vd due to current flow through series-connected resistors 217 and 218. In the clamping mode, if Vd pulses to a negative voltage, then the voltage Viso drops and is clamped at approximately −0.7 volts due to the PN junction between the substrate and the N+ buried layer and sinker structure being forward biased. Although Viso is clamped and prevented from going more negative than −0.7 volt, the voltage Vd on the drain can continue to go more negative. The voltage Vd may spike down to −5.0 volts without there being a harmful inrush of current flowing from the substrate and into the drain. There is no large surge of current from the isolation structure electrode 211 to the drain electrode 200 due to the tracking and clamping circuit 216 having the relatively large resistance (for example, 10k ohms) in this situation.

FIG. 18 is a circuit diagram of the ESD1 circuit 190 of FIG. 6. The stack of two series-connected N-channel transistors 291-292 will breakdown and allow an ESD protection current to flow from conductor 174 to conductor 176 if the voltage on conductor 174 is more than approximately +20.0 volts higher than the voltage on conductor 176. ESD1 circuit will also allow an ESD protection current to flow if the voltage on conductor 174 is more than approximately −0.7 volts below the voltage on conductor 176.

FIG. 19 is a circuit diagram of the ESD2 circuit 191 of FIG. 6. ESD2 circuit 191 breaks down and conducts an ESD current when the voltage on conductor 176 (and terminal 177) is more than +60.0 volts higher than the voltage on conductor 192. If the voltage on conductor 176 is more than 0.7 volts higher than the voltage on conductor node 287, then diode 280 is forward biased. Each of the N-channel transistors 281-286 will break down if its drain is more than +10.0 volts higher than its source. Because there is a stack of six series-connected N-channel transistors 281-286, current will flow from node 287, through the stack, and to conductor 192 if the voltage on conductor 176 is more than about +60.0 volts higher than the voltage on conductor 192.

ESD2 circuit 191 also conducts an ESD current if the voltage on conductor 176 (and terminal 177) is more negative than −10.0 volts. If the voltage on conductor 192 is more than 0.7 volts higher than the voltage on node 287, then the diode 288 is forward biased. The upper transistor 289 will break down if the voltage on node 287 is more than +10.0 volts higher that the voltage on conductor 176. Accordingly, ESD2 circuit 191 will breakdown and conduct an ESD protection current if the voltage on the conductor 192 is more than +10.0 volts higher than the voltage on conductor 176. Another way to phrase this is that ESD2 circuit 191 will breakdown and conduct an ESD protection current if the voltage on conductor 176 is more negative than −10.0 volts below ground potential on conductor 192. If the voltage on terminal 177 is between −10.0 volts and +60.0 volts (with respect to ground potential on conductor 192), then ESD2 circuit 191 does not conduct an ESD current.

Figure 20:
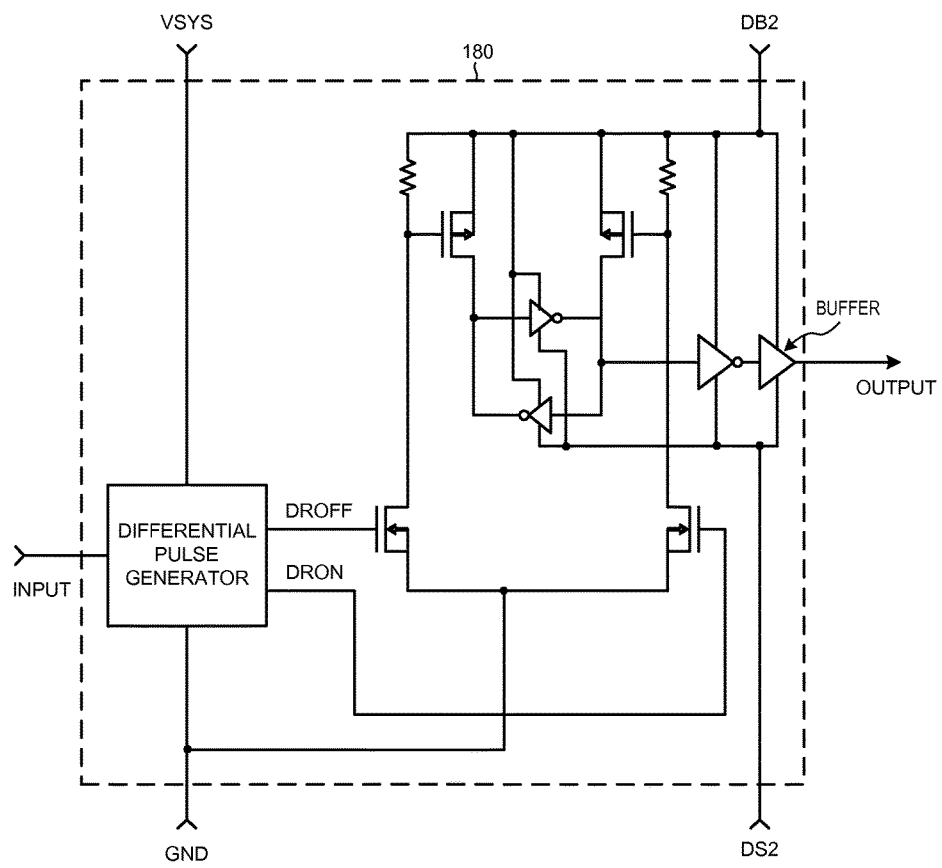
FIG. 20 is a circuit diagram of the level shift circuit of FIG. 6.

FIG. 20 is a circuit diagram of the level shift circuit 180 of FIG. 6. The level shift circuit 180 converts a logic signal from VSYS-to-GND voltage levels to DB2-to-DS2 voltage levels.

Figure 21:
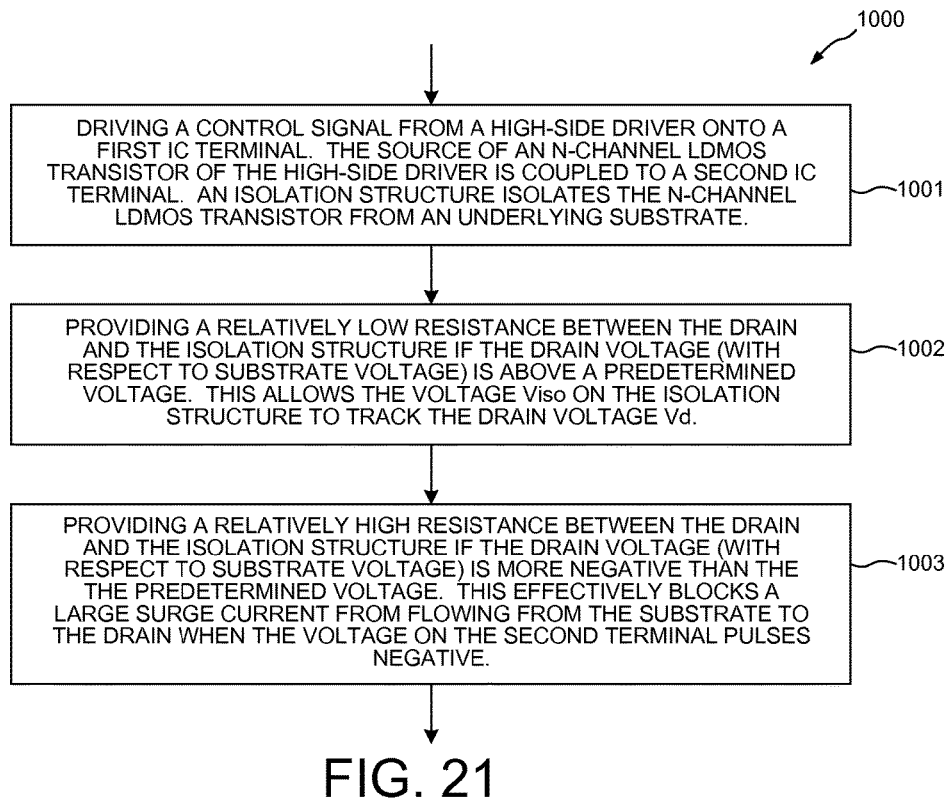
FIG. 21 is a flowchart of a method of operation of the circuit of FIG. 6.

FIG. 21 is a flowchart of a method 1000 of operation of the circuit of FIG. 6. The high-side driver 142 drives (step 1001) a control signal onto terminal 143. The source of the N-channel LDMOS transistor 168 of the high-side driver is coupled to terminal 177. An isolation structure 211 isolates N-channel LDMOS transistor 168 from the underlying substrate 210.

If the drain voltage Vd is above a predetermined voltage (the predetermined voltage may, for example, be −0.7 volts), then the tracking and clamping circuit 216 provides (step 1002) a relatively low resistance path (for example, 500 ohms) between the drain and the isolation structure. This low resistance path allows the voltage Viso on the isolation structure to track the voltage Vd on the drain.

If the drain voltage Vd is more negative than the predetermined voltage (for example is more negative than −0.7 volts), then the tracking and clamping circuit 216 provides (step 1003) a relatively high resistance path between the drain and the isolation structure. This relatively high resistance path effectively blocks a large surge current from flowing from the substrate to the drain when the voltage on terminal 177 pulses negative during a switching of motor currents. The voltage Viso on the isolation structure is clamped at −0.7 volts, and is prevented from going more negative than −0.7 volts. The voltage on the drain, however, can go more negative than −0.7 volts without a harmful surge current flowing from the substrate and to the drain. The peak of the surge current flow (at the time depicted in FIG. 11) from the substrate to the drain electrode in the clamping mode is limited to be less than 500 microamperes by NVSICBC 171.

Although three blocks 1001, 1002 and 1003 are illustrated in a column in FIG. 21, it is to be understood that the operations set forth in the various blocks need not occur in sequence but rather can occur simultaneously, or in different orders. For example, the control signal of step 1001 is being driven at all times in one example, but in this example the overall circuit operates in either the condition of step 1002 or the condition of step 1003 at a give time. As the circuit operates, operation goes back and forth between the conditions of steps 1002 and 1003, depending on how the high-side driver is being controlled.

Although certain specific embodiments are described above for instructional purposes, the teachings of this patent document have general applicability and are not limited to the specific embodiments described above. The tracking and clamping circuit can be realized in various ways using different circuits and types of circuit components and need not include two resistors and one diode. The substrate material into which the N-channel LDMOS transistor of the high-side driver is formed may be wafer monocrystalline silicon material or may be an epitaxial layer disposed over wafer material. The LDMOS transistors of the high-side drivers can be fabricated using any suitable one of several different known and commercially used semiconductor fabrication processes including a BiCDMOS semiconductor fabrication process. Accordingly, various modifications, adaptations, and combinations of various features of the described embodiments can be practiced without departing from the scope of the invention as set forth in the claims.

What is claimed is:
1. An integrated circuit comprising:
a first terminal;

a second terminal;
a third terminal;
a P-channel field effect transistor, wherein a source of the P-channel transistor is coupled to the first terminal, wherein a drain of the P-channel transistor is coupled to the second terminal;
an N-channel field effect transistor, wherein a drain of the N-channel transistor is coupled to the second terminal, wherein a source of the N-channel transistor is coupled to the third terminal, wherein an N type isolation structure is disposed between a substrate and the drain of the N-channel transistor; and
a tracking and clamping circuit connected to the drain of the N-channel field effect transistor and that in a tracking mode provides a relatively low resistance path between the drain and the isolation structure such that when a voltage Vd on the drain is substantially positive that a voltage Viso on the isolation structure tracks Vd, whereas the tracking and clamping circuit in a clamping mode provides a relatively high resistance path between the drain and the isolation structure such that when Vd is substantially negative that Viso is clamped to be no more negative than approximately −0.7 volts.

2. The integrated circuit of claim 1, wherein the relatively low resistance path has a resistance of less than approximately two thousand ohms, wherein the relatively high resistance path has a resistance of more than approximately two thousand ohms, wherein the relatively low resistance path is provided by the tracking and clamping circuit if Vd is substantially greater than Viso, and wherein the relatively high resistance path is provided by the tracking and clamping circuit if Vd is substantially less than Viso.

3. The integrated circuit of claim 1, wherein both the P-channel transistor and the N-channel transistor are disposed on the substrate, and wherein the isolation structure includes an N type isolation buried layer and an N type isolation sinker that together isolate a P type well region from the substrate.

4. The integrated circuit of claim 1, further comprising:
a level shift circuit that receives a control signal and that supplies a level shifted version of the control signal onto a gate of the N-channel transistor and onto a gate of the P-channel transistor.

5. The integrated circuit of claim 1, further comprising:
an electrostatic discharge (ESD) protection circuit coupled between the third terminal and a ground conductor, wherein the ESD protection circuit cannot conduct an ESD protection current unless the voltage on the third terminal with respect to ground potential on the ground conductor is less than a predetermined negative voltage or is greater than a predetermined positive voltage, wherein the predetermined negative voltage is a negative voltage that is more negative than approximately −5.0 volts.

6. The integrated circuit of claim 1, wherein the integrated circuit is a power management integrated circuit and includes a processor and a plurality of high-side drivers, wherein the P-channel transistor, the N-channel transistor and the tracking and clamping circuit are parts of one of the high-side drivers.

7. A method comprising:
(a) driving a control signal from a high-side driver onto a first terminal of an integrated circuit, wherein the high-side driver is a part of the integated circuit, wherein the high-side driver includes an N-channel field effect transistor, wherein a drain of the N-channel field effect transistor is coupled to the first terminal of the integrated circuit, wherein a source of the N-channel field effect transistor is coupled to a second terminal of the integrated circuit, and wherein an N type isolation structure is disposed between the N-channel field effect transistor and a substrate and a tracking and clamping circuit connected to the drain of the N-channel field effect transistor;

(b) in a tracking mode providing a relatively low resistance path between the drain and the isolation structure such that when a voltage Vd on the drain with respect to a voltage Vsub on the substrate is substantially positive that a voltage Viso on the isolation structure tracks Vd; and (c) in a clamping mode providing a relatively high resistance path between the drain and the isolation structure such that when Vd is substantially negative that Viso is clamped to be no more negative than approximately −0.7 volts.

8. The method of claim 7, wherein the relatively low resistance path has a resistance of less than approximately two thousand ohms, wherein the relatively high resistance path has a resistance of more than approximately two thousand ohms, wherein the relatively low resistance path is provided by the tracking and clamping circuit if Vd is substantially greater than Viso, and wherein the relatively high resistance path is provided by the tracking and clamping circuit if Vd is substantially less than Viso.

9. The method of claim 8, further comprising:
receiving a control signal and supplying a level shifted version of the control signal onto a gate of the N-channel field effet transistor and onto a gate of the P-channel field effect transistor.

10. The method of claim 7, further comprising:
communicating control information from a processor of the integrated circuit to the high-side driver such that the high-side driver drives a control signal onto the first terminal.

11. An integrated circuit comprising:
a first terminal;
a second terminal;
a third terminal;
a P-channel field effect transistor, wherein a source of P-channel transistor is coupled to the first terminal, wherein a drain of the P-channel transistor is coupled to the second terminal;
an N-channel field effect transistor, wherein a drain of the N-channel transistor is coupled to the second terminal, wherein a source of the N-channel transistor is coupled to the third terminal, wherein an N type isolation structure is disposed between the N-channel transistor and a substrate; and
means for tracking and clamping connected to the drain of the N-channel transistor such that when a voltage Vd on the drain is substantially positive that a voltage Viso on the isolation structure tracks Vd, and for coupling the drain of the N-channel transistor to the isolation structure such that when Vd is substantially negative that Viso is clamped to be no more negative than a predetermined negative voltage.

12. The integrated circuit of claim 11, further comprising:
a level shift circuit that receives a control signal and that supplies a level shifted version of the control signal onto a gate of the N-channel field effect transistor and onto a gate of the P-channel field effect transistor.

13. The integrated circuit of claim 11, wherein the means for tracking and clamping allows Viso to track Vd when Vd is substantially positive by providing a relatively low resistance path between the drain of the N-channel transistor and the isolation structure, and wherein the means for tracking and clamping provides a relatively high resistance path between the drain of the N-channel transistor and the isolation structure when Viso is clamped to be no more negative than the predetermined negative voltage.

14. The integrated circuit of claim 11, wherein the means for tracking and clamping comprises two resistors coupled in series, and a diode coupled in parallel with one of the two resistors.

15. The integrated circuit of claim 11, wherein the predetermined negative voltage is approximately −0.7 volts.

16. The integrated circuit of claim 11, wherein the substrate is a P type substrate, and wherein the N type isolation structure comprises an N type buried layer and an N type sinker.

17. The integrated circuit of claim 11, wherein the integrated circuit is a power management integrated circuit and includes a processor and a plurality of high-side drivers, wherein the P-channel transistor, the N-channel transistor and the means for tracking and clamping are parts of one of the high-side drivers.

18. A power management integrated circuit comprising:
a plurality high-side drivers and low-side drivers organized in pairs, wherein each of the high-side drivers comprises:
a P-channel field effect transistor;
an N-channel field effect transistor having a drain that is coupled to a drain of the P-channel field effect transistor, wherein the N-channel field effect transistor has a source that is coupled to a terminal of the integrated circuit, wherein an N type isolation structure is disposed between the N-channel transistor and a substrate of the integrated circuit; and
means for tracking and clamping connected to the drain such that when a voltage on the terminal is substantially positive that a voltage Viso on the isolation structure tracks a voltage Vd on the drain, and for coupling the drain and the isolation structure such that when the voltage on the terminal is substantially negative that Viso is clamped to be no more negative than a predetermined negative voltage; and
a processor that outputs control information to the plurality of high-side drivers and low-side drivers and thereby causes the high-side drivers and the low-side drivers to output control signals onto terminals of the integrated circuit.

19. The power management integrated circuit of claim 18, wherein the means prevents a large substrate surge current from flowing through the high-side driver when the voltage on the terminal spikes negative as a result of a switching of an inductive load coupled to the terminal.

20. The power management integrated circuit of claim 18, wherein the means limits a peak magnitude of a surge current flowing through the high-side driver when the voltage on the terminal spikes negative as a result of a switching of an inductive load coupled to the terminal, and wherein the means limits this peak current to have a peak of less than approximately five hundred microamperes.

21. A power management integrated circuit comprising:
a plurality high-side drivers and low-side drivers organized in pairs, wherein each of the high-side drivers comprises:
a P-channel field effect transistor;
an N-channel field effect transistor having a drain that is coupled to a drain of the P-channel field effect transistor, wherein the N-channel field effect transistor has a source that is coupled to a terminal of the integrated circuit, wherein an N type isolation structure is disposed between the N-channel transistor and a substrate of the integrated circuit; and
means for tracking and clamping connected to the isolation structure for preventing a large substrate surge current from flowing through the terminal and through the high-side driver when the voltage on the terminal spikes negative as a result of a switching of an inductive load coupled to the terminal and wherein a voltage Viso on the isolation structure is clamped to a predetermined voltage when the voltage on the terminal spikes negative as a result of the switching; and
a processor that outputs control information to the plurality of high-side drivers and low-side drivers and thereby causes the high-side drivers and the low-side drivers to output control signals onto terminals of the integrated circuit.

22. The power management integrated circuit of claim 21, wherein the means provides a resistive current path between the drain of the N-channel field effect transistor and the N type isolation structure.

* * * * *